(12) United States Patent
Reichle et al.

(10) Patent No.: US 6,754,861 B2
(45) Date of Patent: *Jun. 22, 2004

(54) CIRCUITRY FOR AND SYSTEM AND SUBSTRATE WITH CIRCUITRY FOR ALIGNING OUTPUT SIGNALS IN MASSIVELY PARALLEL TESTERS AND OTHER ELECTRONIC DEVICES

(75) Inventors: David A. Reichle, Boise, ID (US); Charles K. Snodgrass, Boise, ID (US); Charles S. Alexander, Boise, ID (US); Fremont S. Smith, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/164,975

(22) Filed: Jun. 6, 2002

(65) Prior Publication Data

US 2002/0152437 A1 Oct. 17, 2002

Related U.S. Application Data

(63) Continuation of application No. 09/602,203, filed on Jun. 22, 2000, now Pat. No. 6,430,725, which is a continuation of application No. 09/137,738, filed on Aug. 21, 1998, now Pat. No. 6,158,030.

(51) Int. Cl.[7] .......................... G06F 11/00; H03M 13/00

(52) U.S. Cl. ................... 714/724; 714/700; 714/736; 714/815; 327/261; 713/503

(58) Field of Search ........................... 714/724, 700, 714/736, 738, 815; 327/261, 263, 269, 270, 271, 276, 277; 713/503

(56) References Cited

U.S. PATENT DOCUMENTS

| 4,900,948 A | 2/1990 | Hamilton ..................... 307/149 |
| 4,929,888 A | 5/1990 | Yoshida ....................... 714/736 |
| 5,327,076 A | 7/1994 | Bailey ....................... 324/158.1 |
| 5,379,299 A | 1/1995 | Schwartz .................... 370/108 |
| 5,384,781 A | 1/1995 | Kawabata ................... 714/700 |
| 5,459,422 A | 10/1995 | Behrin ........................ 327/276 |
| 5,566,188 A | 10/1996 | Robbins et al. ............. 714/738 |
| 5,638,016 A | 6/1997 | Eitrheim ..................... 327/175 |
| 5,682,472 A | 10/1997 | Brehm et al. ................. 714/31 |
| 5,935,257 A | 8/1999 | Nishimura .................. 713/503 |

FOREIGN PATENT DOCUMENTS

GB 2129634 A 5/1984

OTHER PUBLICATIONS

Micro Control Company "New Product Release" Feb. 21, 1997.
Micro Control Company article entitled "A Massively Parallel Memory Device Testing Strategy" by Harold E. Hamilton and Charles H. Morris—Jun. 6, 1998, or earlier.

Primary Examiner—Emmanuel L. Moise
(74) Attorney, Agent, or Firm—TraskBritt

(57) ABSTRACT

Signal alignment circuitry aligns (i.e., deskews) test signals from a massively parallel tester. A timing portion of each signal is received by a rising edge delay element, a falling edge delay element, and a transition detector, all in parallel. The delay of the rising edge and falling edge delay elements is independently controlled by control circuitry. The outputs of the rising edge and falling edge delay elements are muxed together, and the output of the mux is selected in response to rising edge and falling edge transitions detected by the transition detector. The output of the mux is provided to pulse generating circuitry, which generates a pulse at each edge for use in clocking a data portion of each signal into a DQ flip-flop. The output of this DQ flip-flop is then latched in to another DQ flip-flop by a reference clock.

23 Claims, 4 Drawing Sheets

CIRCUITRY FOR AND SYSTEM AND SUBSTRATE WITH CIRCUITRY FOR ALIGNING OUTPUT SIGNALS IN MASSIVELY PARALLEL TESTERS AND OTHER ELECTRONIC DEVICES

CROSS-REFERENCE TO RELATED APPLICATIONS

This application is a continuation of application Ser. No. 09/602,203 filed Jun. 22, 2000, U.S. Pat. No. 6,430,725, which is a continuation of application Ser. No. 09/137,738, filed Aug. 21, 1998, now U.S. Pat. No. 6,158,030, issued Dec. 5, 2000.

BACKGROUND OF THE INVENTION

1. Technical Field

This invention relates in general to electronic circuits and, more specifically, to systems and methods for aligning (i.e., deskewing) signals output by electronic circuits. The invention is particularly applicable to aligning test signal outputs of massively parallel testers for use by semiconductor devices under test.

2. State of the Art

As shown in FIG. 1, a massively parallel tester 10 of the related art is used to test a "massive" number of semiconductor devices 12, each temporarily attached to one of a series of Device Under Test (DUT) boards 14 that connect to the tester 10 via connectors 16 (not all shown). It will be understood that relatively few devices 12 are actually illustrated in FIG. 1 while, in fact, the tester 10 typically tests thousands of devices 12 at once.

The tester 10 sends various test signals to the devices 12 while they are under test. For example, if the devices 12 are Dynamic Random Access Memory (DRAM) devices, the tester 10 typically sends control signals (e.g., RAS, CAS, WE, etc.), address signals, and data signals to each of the devices 12. Unfortunately, skew is typically introduced into these test signals as a result of variations in the driver propagation delay, switching speed, and transmission line effects associated with the different, and often lengthy, paths that these signals take to each of the devices 12. As used herein, "skew" means a deviation in the timing relationship among signals that occurs between the location from which the signals are sent and the location at which the signals are received.

Accordingly, a number of methods are used to deskew these signals before they arrive at the devices 12. In one such method, the test signals are observed manually using an oscilloscope, and the timing of the signals is then adjusted to eliminate any skew. While this method works to limit or eliminate skew under the conditions present at the time the deskewing operation takes place, it does not work over time when variations in the tester 10 and its environment vary the skew. In addition, the manual use of an oscilloscope is a cumbersome operation that leads to less than frequent deskewing operations. In another typical method, Time Domain Response (TDR) test equipment sends pulses down the paths normally followed by the test signals in order to determine the delay associated with each path. With this delay determined for each path, the timing of the test signals can be varied so the signals are deskewed upon arrival at their respective device 12. While this method is more convenient than the oscilloscope method described above, the TDR electronics are generally complex and costly.

Therefore, there is a need in the art for an improved system and method for deskewing test and other signals output by a massively parallel tester and other electronic devices that avoid the problems associated with the conventional deskewing methods and devices described above.

BRIEF SUMMARY OF THE INVENTION

In an inventive method for aligning signals (e.g., test signals), the signals are delayed by, for example, delay elements controlled by control circuitry. The delayed signals are then latched in to, for example, DQ flip-flops using a reference clock. The delaying of the signals is then varied until a transition occurs in each of the latched-in delayed signals. At this point, it is possible to align the signals with their rising edges and/or falling edges occurring at the same time by delaying the signals until they transition.

In another embodiment of this invention, the acts of the embodiment described above are followed by adjusting (e.g., delaying) the timing of the latching-in of the delayed signals by a fixed amount of time (e.g., 15 nanoseconds). Once this is accomplished, the delaying of the signals is varied again until a transition occurs in each of the latched-in delayed signals. Then, the delay of each of the signals at which a transition occurs prior to adjusting the timing of the latching-in, the delay of each of the signals at which a transition occurs after adjusting the timing of the latching-in, and the fixed amount of time by which the timing of the latching-in is adjusted are used to characterize a delay function of each of the signals. The delaying of each of the signals is then adjusted in accordance with its respective delay function to align the signals.

In a further embodiment of this invention, circuitry for aligning (i.e., deskewing) a plurality of signals includes circuitry for delaying the signals and circuitry for latching-in the delayed signals. In order to align the signals, control circuitry adjusts the delaying of the signals until a transition occurs in each of the latched-in delayed signals.

In other embodiments of this invention, the circuitry described above is incorporated into a massively parallel test system, a Device Under Test (DUT) board, an interface board, a massively parallel tester, and a semiconductor substrate (e.g., a semiconductor wafer).

DETAILED DESCRIPTION OF THE INVENTION

Figure 1:
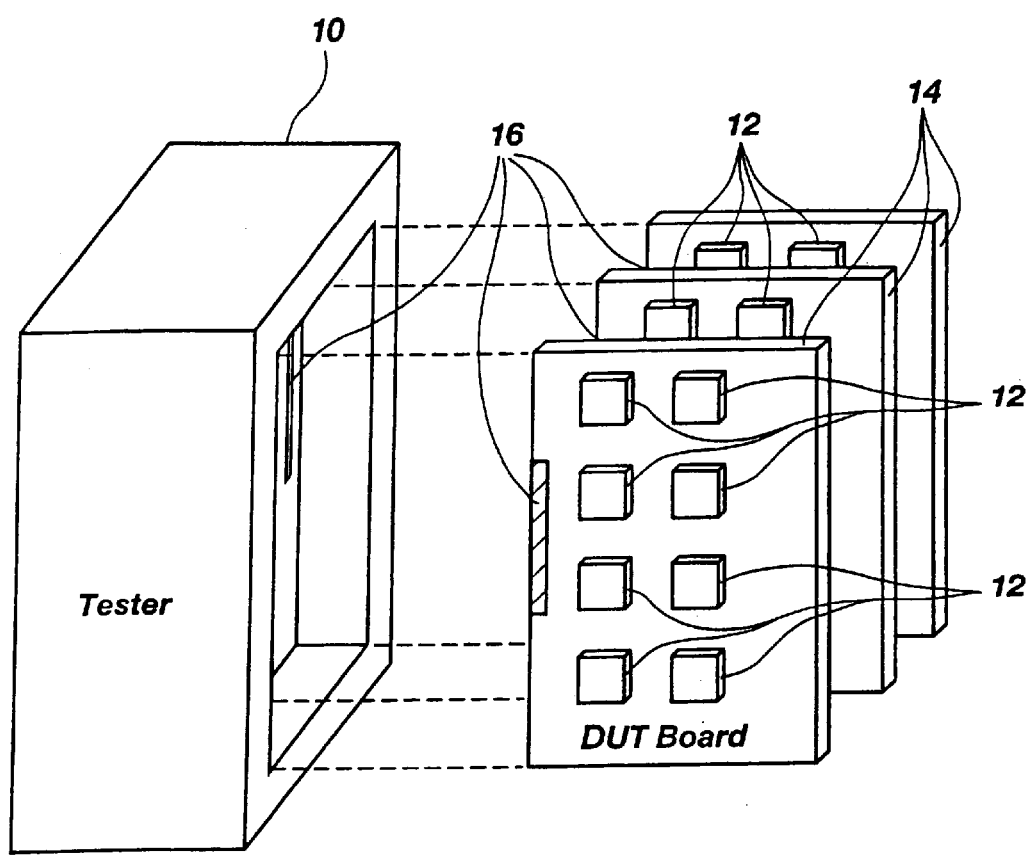
FIG. 1 is an isometric view of a representative massively parallel tester of the related art and some of its associated Device Under Test (DUT) boards.
Figure 2:
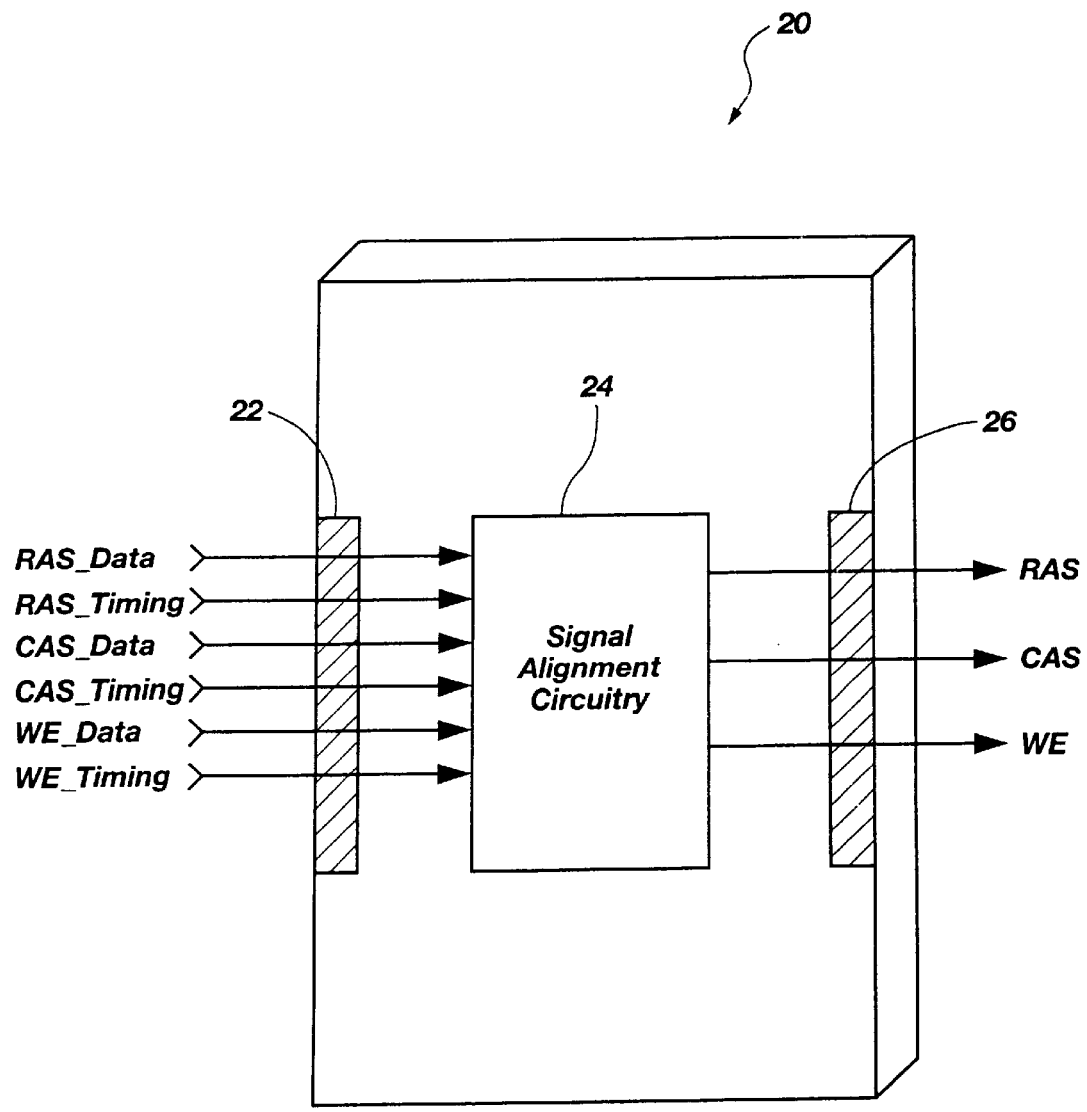
FIG. 2 is an isometric view of an interface board in accordance with this invention that can be inserted between the DUT boards and the tester of FIG. 1 and includes inventive signal alignment circuitry.

As shown in FIG. 2, an interface board 20 is adapted to operate as an interface between the tester 10 (FIG. 1) and one of the DUT boards 14 (FIG. 1). Specifically, a connector 22 connects to the tester 10 to receive raw test signals RAS_Data, RAS_Timing, CAS_Data, CAS_Timing, WE_Data, and WE_Timing from the tester 10 for signal alignment circuitry 24. The signal alignment circuitry 24 deskews the raw test signals and outputs deskewed test signals RAS, CAS, and WE to one of the DUT boards 14 through a connector 26.

Although the signal alignment circuitry 24 of this invention will be described herein as being incorporated into the interface board 20, it will be understood by those having skill in the technical field of this invention that the signal alignment circuitry 24, or portions thereof, can, instead, be incorporated into the tester 10, one of the DUT boards 14 with which the circuitry 24 is associated, or both. It will also be understood that this invention is applicable to any electronic device having signals requiring deskewing. Further, although this invention will be described with respect to timing signals typically associated with Dynamic Random Access Memory (DRAM) devices (e.g., RAS, CAS, and WE), it will be understood that this invention is equally applicable to testing or communicating with other devices.

Figure 3:
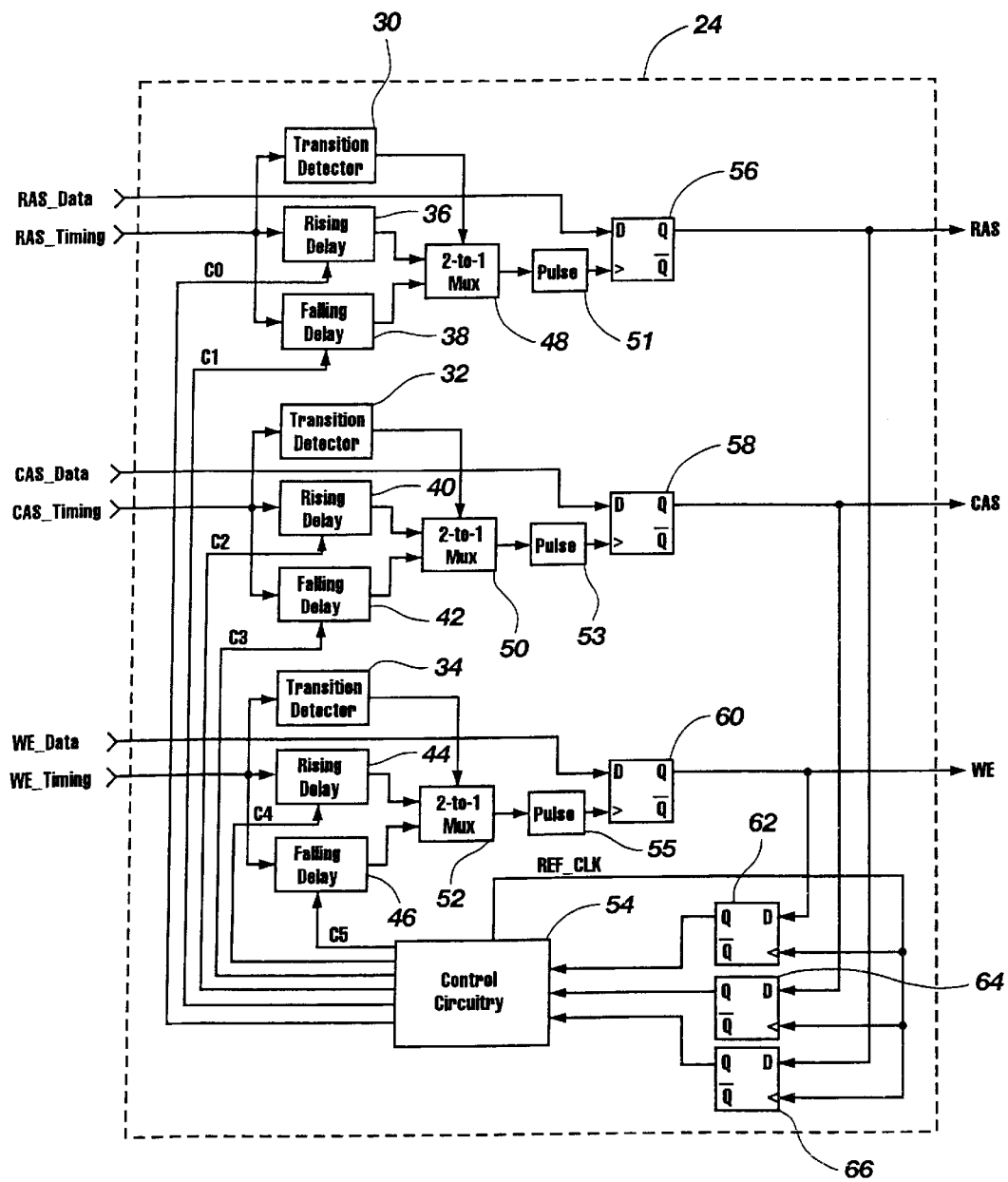
FIG. 3 is a block diagram showing a more detailed view of the signal alignment circuitry of FIG. 2.

As shown in more detail in FIG. 3, the signal alignment circuitry 24 receives the raw test signals RAS_Timing, CAS_Timing, and WE_Timing with transition detectors 30, 32, and 34, rising delay elements 36, 40, and 44, and falling delay elements 38, 42, and 46. When the transition detectors 30, 32, and 34 detect a rising edge in the respective raw test signals RAS_Timing, CAS_Timing, and WE_Timing, the detectors 30, 32, and 34 output control signals (e.g., "1" bits) to respective 2-to-1 muxes 48, 50, and 52, causing the muxes 48, 50, and 52 to selectively output respective test signals RAS_Timing, CAS_Timing, and WE_Timing delayed by respective rising delay elements 36, 40, and 44. Conversely, when the transition detectors 30, 32, and 34 detect a falling edge in the respective raw test signals RAS_Timing, CAS_Timing, and WE_Timing, the detectors 30, 32, and 34 output control signals (e.g., "0" bits) to respective 2-to-1 muxes 48, 50, and 52, causing the muxes 48, 50, and 52 to selectively output respective test signals RAS_Timing, CAS_Timing, and WE_Timing delayed by respective falling delay elements 38, 42, and 46. The amount of delay introduced by the delay elements 36, 38, 40, 42, 44, and 46 is individually controlled by control signals C0, C1, C2, C3, C4, and C5 output by control circuitry 54, as will be described in greater detail below.

The delayed test signals selected by the 2-to-1 muxes 48, 50, and 52 are output to respective pulse generating circuits 51, 53, and 55, which generate a pulse for each rising and falling edge received. The outputs of the pulse generating circuits 51, 53, and 55 are then provided to clock inputs of respective DQ flip-flops 56, 58, and 60. These DQ flip-flops 56, 58, and 60 also receive respective raw test signals RAS_Data, CAS_Data, and WE_Data and latch these signals to their respective Q outputs as deskewed test signals RAS, CAS, and WE in accordance with the signals received at their respective clock inputs. These deskewed test signals RAS, CAS, and WE are then output to one of the DUT boards 14 (FIG. 1) and, at the same time, DQ flip-flops 62, 64, and 66 latch these signals to their Q outputs in accordance with a clock signal REF_CLK received from the control circuitry 54. The latched Q outputs of the DQ flip-flops 62, 64, and 66 are then provided to the control circuitry 54 for use in a manner that will now be described.

To aid the reader in understanding this invention, deskewing operations of the signal alignment circuitry 24 will be described hereafter primarily with respect to the test signal RAS. It will be understood, though, that deskewing operations with respect to the other test signals CAS and WE operate in a corresponding manner.

Deskewing of the test signal RAS occurs in three steps. In the first step, the control circuitry 54 uses the control signal C0, for example, to increase the delay of the delay element 36 until a transition occurs on the Q output of the DQ flip-flop 62, at which time the control circuitry 54 records the state of the control signal C0. This state will be referred to as $S_{RISE\_0}$. The control circuitry 54 then uses the control signal C1, for example, to increase the delay of the delay element 38 until a transition occurs on the Q output of the DQ flip-flop 62, at which time the control circuitry 54 records the state of the control signal C1. This state will be referred to as $S_{FALL\_0}$.

In the second step, the clock signal REF_CLK output by the control circuitry 54 is delayed by a fixed amount of time (e.g., 15 nanoseconds), referred to as $t_{FIXED}$, and the first step is then repeated so that states $S_{RISE\_1}$ and $S_{FALL\_1}$ are recorded. A functional relationship between the control signals C0 and C1 and the desired rising and falling delays introduced by the respective delay elements 36 and 38 is then characterized in accordance with the following equations.

$$C0 = [(S_{RISE\_1} - S_{RISE\_0}) \div t_{FIXED}] \times \text{rising delay} + S_{min}$$

$$C1 = [(S_{FALL\_1} - S_{FALL\_0}) \div t_{FIXED}] \times \text{falling delay} + S_{min}$$

where $S_{min}$ is the state at which the minimum time delay possible out of the delay elements 36 and 38 occurs. Of course, it will be understood that similar equations are also determined for the rising and falling edges of the CAS signal and the WE signal.

In the third step, the timing of the rising and falling edges of the RAS signal are controlled independently of one another by varying the control signals C0 and C1 in accordance with the equations described above to provide the RAS signal at a desired pulse width to one of the DUT boards 14 (FIG. 1). The timing of the RAS signal relative to the CAS and WE signals is controlled in the same manner.

Thus, this invention can independently control the timing of the rising and falling edges of each of the test signals deskewed. This allows for a tremendous variety of tests to be performed on the devices 12 (FIG. 1) under test, because the pulse width of each test signal, and its relative timing with respect to the other test signals, can be controlled. For example, it might be desirable to stress a DRAM device by testing it at its rated minimum delay $T_{RCD}$ between activation of the RAS signal and activation of the CAS signal. This invention allows performance of this test, if desired, by controlling the relative timing between the rising edge of the RAS signal and the rising edge of the CAS signal.

It should be noted that it is desirable for the total switching time of the transition detectors 30, 32, and 34 and their respective 2-to-1 muxes 48, 50, and 52 to be less than the minimum delay associated with the delay elements 36, 38, 40, 42, 44, and 46. This allows the muxes 48, 50, and 52 to switch before receiving a delayed signal. It should also be noted that it is desirable for the delay $t_{FIXED}$ associated with the clock REF_CLK in the second step described above to be less than the pulse width of the test signals RAS_Data, CAS_Data, and WE_Data.

Further, it should be noted that additional embodiments of this invention may dispense with the transition detectors 30, 32, and 34, the delay elements 36, 38, 40, 42, 44, and 46, and the muxes 48, 50, and 52 if independent control over the rising and falling edges of the test signals is not desired. In addition, it should be noted that step two described above may be dispensed with if the rising and/or falling edges of all the test signals being deskewed are to rise and/or fall at the same time. In this case, step three described above would occur with respect to the states determined in step one described above, rather than with respect to the equation determined in step two. Also, the term "align" used herein is meant to refer generally to the process of controlling the relative timing of signals with respect to one another, and it does not necessarily mean that the rising and/or falling edges of the controlled signals rise and/or fall at the same time.

Figure 4:
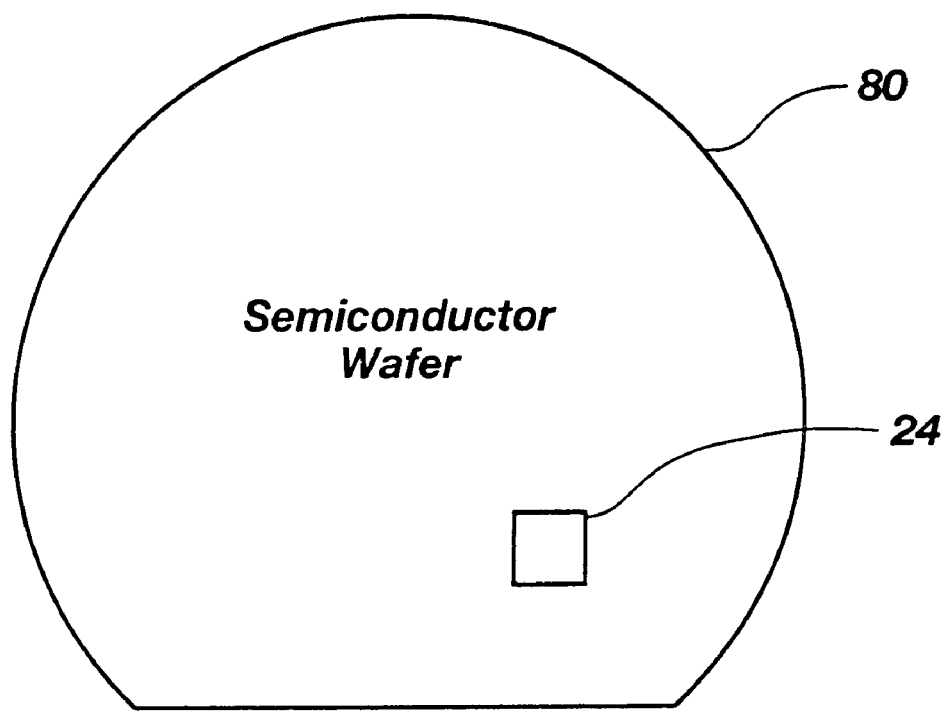
FIG. 4 is a diagram of a semiconductor wafer on which a die incorporating the signal alignment circuitry of FIGS. 2 and 3 is fabricated.

As shown in FIG. 4, the signal alignment circuitry 24 of FIGS. 2 and 3 is fabricated on the surface of a semiconductor wafer 80 of silicon, gallium arsenide, or indium phosphide in accordance with this invention. Of course, it should be understood that the circuitry 24 may be fabricated on semiconductor substrates other than a wafer, such as a Silicon-on-Insulator (SOI) substrate, a Silicon-on-Glass (SOG) substrate, a Silicon-on-Sapphire (SOS) substrate, or other semiconductor material layers on supporting substrates.

Although this invention has been described with reference to particular embodiments, the invention is not limited to these described embodiments. Rather, the invention is limited only by the appended claims, which include within their scope all equivalent devices or methods that operate according to the principles of the invention as described.

What is claimed is:

1. Circuitry for aligning at least two signals, comprising:
    delay circuitry configured to receive a timing signal corresponding to each of the at least two signals and to output a delayed timing signal corresponding to each of the at least two signals;
    output circuitry operably coupled to the delay circuitry, the output circuitry configured to transmit at least a portion of a data signal corresponding to each of the at least two signals in response to receiving the corresponding delayed timing signal from the delay circuitry; and
    control circuitry operably coupled to the delay circuitry and the output circuitry, the control circuitry configured to adjust a delay of the delay circuitry in response to the transmitted at least a portion of the data signal.

2. The circuitry of claim 1, wherein the delay circuitry is further configured to separately delay rising and falling transitions of the timing signal corresponding to each of the at least two signals.

3. The circuitry of claim 2, wherein the delay circuitry comprises, for each of the at least two signals:
    a rising edge delay element configured to delay the rising transition of the timing signal;
    a falling edge delay element configured to delay the falling transition of the timing signal;
    transition detection circuitry configured to detect rising and falling edges of the timing signal; and
    a mux operably coupled to the rising and falling edge delay elements and to the transition detection circuitry, the mux configured to output the delayed timing signal by selecting from the delayed rising transition of the timing signal and from the delayed falling transition of the timing signal when respective rising and falling edges are detected in the timing signal by the transition detection circuitry.

4. The circuitry of claim 2, wherein the output circuitry comprises, for each of the at least two signals:
    a pulse circuit configured to receive the delayed timing signal from the delay circuitry, the pulse circuit configured to generate a pulse for each delayed rising and falling transition of the timing signal received; and
    a DQ flip-flop operably coupled to the pulse circuit, the DQ flip-flop configured to transmit the at least a portion of the data signal in response to receiving the pulse.

5. The circuitry of claim 1, further comprising latching circuitry operably coupled between the output circuitry and the control circuitry, the latching circuitry configured to latch-in the transmitted at least a portion of the data signal to the control circuitry.

6. The circuitry of claim 5, wherein the latching circuitry comprises at least two DQ flip-flops, one DQ flip-flop corresponding to each of the at least two signals, wherein the at least two DQ flip-flops are clocked by a reference clock.

7. The circuitry of claim 6, wherein the reference clock is configured to delay the latched-in portion of the data signal by a fixed amount of time.

8. The circuitry of claim 7, wherein the fixed amount of time is substantially less than a pulse width of any of the at least two signals.

9. The circuitry of claim 1, wherein the aligning circuitry is configured to receive the at least two signals from a massive parallel tester.

10. The circuitry of claim 1, wherein the output circuitry is configured to communicate the transmitted at least a portion of the data signal corresponding to each of the at least two signals to a device under test.

11. A test system comprising:
    a massively parallel tester configured to output at least two test signals;
    at least one Device Under Test (DUT) board configured to temporarily secure at least one DUT thereto, wherein the DUT board is further configured to receive the at least two test signals from the tester and supply them to the at least one DUT; and
    at least one interface board configured to operably couple the at least one DUT board to the tester, the at least one interface board comprising:
        delay circuitry configured to receive a timing signal corresponding to each of the at least two test signals and to output a delayed timing signal corresponding to each of the at least two test signals;
        output circuitry operably coupled to the delay circuitry, the output circuitry configured to transmit at least a portion of a data signal corresponding to each of the at least two test signals to the at least one DUT in response to receiving the corresponding delayed timing signal from the delay circuitry; and
        control circuitry operably coupled to the delay circuitry and the output circuitry, the control circuitry configured to adjust a delay of the delay circuitry in response to the transmitted at least a portion of the data signal.

12. A Device Under Test (DUT) board configured to temporarily secure at least one DUT thereto, the DUT board comprising:
    at least one input configured to receive at least two unaligned test signals; and
    signal aligning circuitry operably coupled to the at least one input, the signal aligning circuitry comprising:
        delay circuitry configured to receive a timing signal corresponding to each of the at least two unaligned test signals and to output a delayed timing signal corresponding thereto;
        output circuitry operably coupled to the delay circuitry, the output circuitry configured to transmit at least a portion of a data signal corresponding to each of the at least two unaligned test signals to the at least one DUT in response to receiving the corresponding delayed timing signal from the delay circuitry; and
        control circuitry operably coupled to the delay circuitry and the output circuitry, the control circuitry configured to adjust a delay of the delay circuitry in response to the transmitted at least a portion of the data signal.

13. A semiconductor substrate having signal alignment circuitry fabricated on a surface thereof, the semiconductor substrate comprising:

at least one input configured to receive at least two signals;

delay circuitry configured to receive a timing signal corresponding to each of the at least two signals and to output a delayed timing signal corresponding thereto;

output circuitry operably coupled to the delay circuitry, the output circuitry configured to transmit at least a portion of a data signal corresponding to each of the at least two signals in response to receiving the corresponding delayed timing signal from the delay circuitry; and control circuitry operably coupled to the delay circuitry and the output circuitry, the control circuitry configured to adjust a delay of the delay circuitry in response to the transmitted at least a portion of the data signal.

14. The semiconductor substrate of claim 13, wherein the semiconductor substrate comprises a semiconductor wafer.

15. The semiconductor substrate of claim 13, wherein the delay circuitry is further configured to separately delay rising and falling transitions of the timing signal corresponding to each of the at least two signals.

16. The semiconductor substrate of claim 15, wherein the delay circuitry comprises, for each of the at least two signals:

a rising edge delay element configured to delay the rising transition of the timing signal;

a falling edge delay element configured to delay the falling transition of the timing signal;

transition detection circuitry configured to detect rising and falling edges of the timing signal; and a mux operably coupled to the rising and falling edge delay elements and to the transition detection circuitry, the mux configured to output the delayed timing signal by selecting from the delayed rising transition of the timing signal and from the delayed falling transition of the timing signal when respective rising and falling edges are detected in the timing signal by the transition detection circuitry.

17. The semiconductor substrate of claim 15, wherein the output circuitry comprises, for each of the at least two signals:

a pulse circuit configured to receive the delayed timing signal from the delay circuitry, the pulse circuit configured to generate a pulse for each delayed rising and falling transition of the timing signal received; and a DQ flip-flop operably coupled to the pulse circuit, the DQ flip-flop configured to transmit the at least a portion of the data signal in response to receiving the pulse.

18. The semiconductor substrate of claim 13, further comprising latching circuitry operably coupled between the output circuitry and the control circuitry, the latching circuitry configured to latch-in the transmitted at least a portion of the data signal to the control circuitry.

19. The semiconductor substrate of claim 18, wherein the latching circuitry comprises at least two DQ flip-flops, one DQ flip-flop corresponding to each of the at least two signals, wherein the at least two DQ flip-flops are clocked by a reference clock.

20. The semiconductor substrate of claim 19, wherein the reference clock is configured to delay the latched-in portion of the data signal by a fixed amount of time.

21. The semiconductor substrate of claim 20, wherein the fixed amount of time is substantially less than a pulse width of any of the at least two signals.

22. The semiconductor substrate of claim 13, wherein the at least one input is configured to receive the at least two signals from a massive parallel tester.

23. The semiconductor substrate of claim 13, wherein the output circuitry is configured to communicate the transmitted at least a portion of the data signal corresponding to each of the at least two signals to a device under test.

* * * * *

UNITED STATES PATENT AND TRADEMARK OFFICE
CERTIFICATE OF CORRECTION

PATENT NO. : 6,754,861 B2
DATED : June 22, 2004
INVENTOR(S) : David A. Reichle et al.

It is certified that error appears in the above-identified patent and that said Letters Patent is hereby corrected as shown below:

Column 1,
Line 10, after "2000," insert -- now -- and after "6,430,725," insert -- issued Aug. 6, 2002, --.

Column 6,
Line 18, change "massive" to -- massively --.

Column 8,
Line 34, change "massive" to -- massively --.

Signed and Sealed this

Fourteenth Day of February, 2006

JON W. DUDAS
*Director of the United States Patent and Trademark Office*